United States Patent [19]
Rangasayee

[11] Patent Number: 6,104,208
[45] Date of Patent: Aug. 15, 2000

[54] PROGRAMMABLE LOGIC DEVICE INCORPORATING FUNCTION BLOCKS OPERABLE AS WIDE-SHALLOW RAM

[75] Inventor: Krishna Rangasayee, Sunnyvale, Calif.

[73] Assignee: Altera Corporation, San Jose, Calif.

[21] Appl. No.: 09/191,419

[22] Filed: Nov. 12, 1998

Related U.S. Application Data

[60] Provisional application No. 60/076,778, Mar. 4, 1998.

[51] Int. Cl.[7] ............................. G06F 7/38; H03K 19/177
[52] U.S. Cl. ......................... 326/40; 326/39; 365/230.03
[58] Field of Search ................................ 326/38, 39, 40, 326/41; 365/230.03, 230.05

[56] References Cited

U.S. PATENT DOCUMENTS

| | | | |
|---|---|---|---|
| 5,384,738 | 1/1995 | Miyaoka et al. | 365/189.08 |
| 5,744,980 | 4/1998 | McGowan et al. | 326/40 |
| 5,801,547 | 9/1998 | Kean | 326/40 |
| 5,828,229 | 10/1998 | Cliff et al. | 326/40 |
| 5,914,906 | 6/1999 | Iadanza et al. | 365/230.03 |
| 5,933,023 | 8/1999 | Young | 326/40 |
| 6,020,759 | 2/2000 | Heile | 326/40 |

OTHER PUBLICATIONS

Bursky, Dave, "Combination RAM/PLD Opens New Application Options", Electronic Design, pp. 138–140, May 23, 1991.

Intel Corporation "10 ns FLEXlogic FPGA With SRAM Option", INTEL® iFX780, pp. 2–24–2–46, Nov. 1993.

NGAI, Tony Kai-Kit, "An SRAM-Programmable Field-–Reconfigurable Memory",Department of Electrical Engineering, University of Toronto, Thesis for Master of Applied Science, 1994. pp. 1–68.

Altera Corporation APEX 20K Programmable Logic Device Family, ALTERA® Oct. 1998, ver. 1. pp. 1–2.

*Primary Examiner*—Michael Tokar
*Assistant Examiner*—Daniel D. Chang
*Attorney, Agent, or Firm*—Beyer Weaver & Thomas, LLP

[57] ABSTRACT

An integrated circuit capable of efficiently storing data words of varying length is disclosed. The inventive integrated circuit can be a programmable logic device that includes a plurality of configurable memory array blocks. The integrated circuit includes a control circuit that characterizes data to be stored and based upon that characterization provides control signals to direct connectors. The direct connectors then directly connect selected configurable memory array blocks when a single memory array block could not accommodate the data to be stored.

12 Claims, 7 Drawing Sheets

Fig. 1

Prior Art

PROGRAMMABLE LOGIC DEVICE INCORPORATING FUNCTION BLOCKS OPERABLE AS WIDE-SHALLOW RAM

CROSS REFERENCE TO RELATED APPLICATION

This application claims benefit of priority under 35 U.S.C. §119(e) of U.S. Provisional Application Ser. No. 60/076,778, filed Mar. 4, 1998, and entitled "PROGRAMMABLE LOGIC DEVICE INCORPORATING FUNCTION BLOCKS CONFIGURABLE AS WIDE-SHALLOW RAM".

BACKGROUND OF THE INVENTION

1. Field of the Invention

The present invention generally relates to integrated circuits. More particularly, the present invention relates to programmable logic devices providing improved memory storage.

2. Description of the Related Art

A programmable logic device (PLD) is a programmable integrated circuit that allows the user of the circuit, using software control, to customize the logic functions the circuit will perform. The logic functions previously performed by small, medium, and large scale integration integrated circuits can instead be performed by programmable logic devices. When a typical programmable logic device is supplied by an integrated circuit manufacturer, it is not yet capable of performing any specific function. The user, in conjunction with software supplied by the manufacturer or created by the user or an affiliated source, can program the PLD to perform the specific function or functions required by the user's application. The PLD can then function in a larger system designed by the user just as though dedicated logic chips were employed. For the purpose of this description, it is to be understood that a programmable logic device refers to once programmable as well as reprogrammable devices.

Programmable logic encompasses all digital logic circuits that are configured by the end user, including PLDs, field programmable gate arrays (FPGAs) and complex programmable logic devices (CPLDs). These different programmable logic devices can have substantially different architectures. Once common architecture for PLDs or CPLDs is known as an embedded array programmable logic design.

The general architecture of an embedded array programmable logic design will be generally familiar to those knowledgeable of the FLEX10 logic family of devices manufactured by the Altera Corporation of San Jose, Calif. Such an architecture, for example, is described in U.S. Pat. No. 5,550,782 and Altera Data Book 1998, both of which are incorporated herein by reference.

Figure 1:
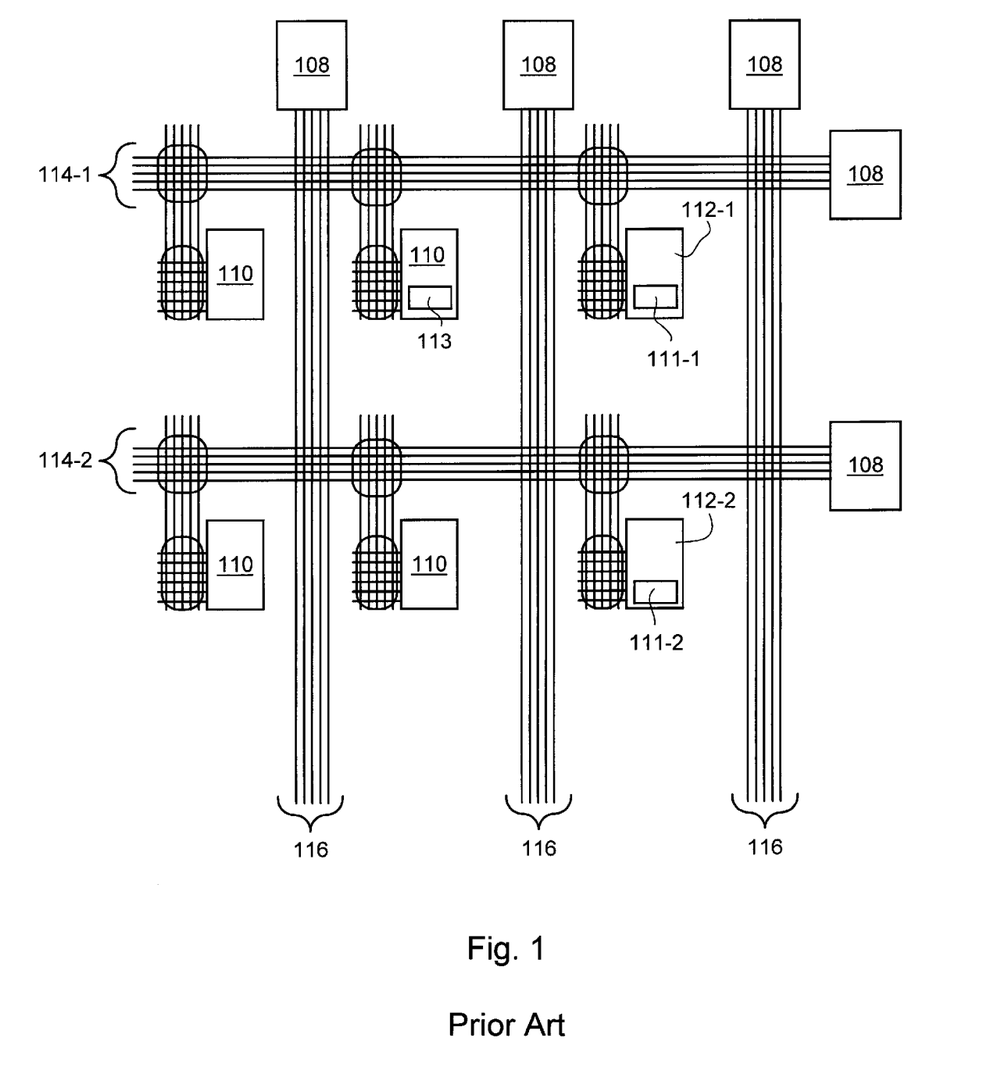
FIG. 1 is a block diagram of a conventional embedded array type complex programmable logic device architecture.

Referring initially to FIG. 1, a conventional CPLD 100 with an embedded array programmable logic design will be described. Although only a few logic array blocks or memory blocks are illustrated, it should be appreciated that any number may be provided in order to meet the needs of a particular system.

The CPLD 100 includes a plurality of logic array blocks (LAB) 110 and a plurality of embedded array blocks (EAB) 112. Each EAB 112 includes a memory array 111. Each LAB 110 includes a plurality of logic elements LE 113 which are each capable of performing simple logic functions.

As shown in FIG. 1, the plurality of LABs 110 and the plurality of EABs 112 are programmably interconnected by way of a plurality global horizontal conductors 114 and a plurality of global vertical conductors 116 to form a logic and memory array. The global horizontal conductors 114 couple to the horizontal ports 108, and the global vertical conductors 116 couple to the vertical ports 106.

The EAB is a flexible block of random access memory (RAM) with registers on the input and output ports. As is known in the art, a RAM is an array of individual memory cells, of which each cell includes a plurality of transistors configured to store digital data in the form of a single bit. Typically, the individual memory cells are arranged to form data words of varying length depending upon the particular application. In practice, data words may be of any length, however, data word lengths of 1, 8, 16, or 32 bits are common but any word length desired by the user is possible. As structured, the RAM device has the ability to access, or read, each stored data bit or data word independently of any other stored data bit or word by selectively enabling desired rows and columns.

By way of example, the existing FLEX10 family of logic devices include EABs each having 2048 memory cells suitably disposed to store up to 2048 bits (otherwise referred to as 2K bits) of data. For example, in the case of the CPLD 100, the 2048 memory cells included in each of the memory arrays 111-1 and 111-2 can be arranged such that the EAB 112-1 and the EAB 112-2, respectively, can operate as a single port RAM device having the following dimensions as detailed in Table 1:

TABLE 1

| Number of Words (Depth) | Length of Each Word in Bits (Width) |
| --- | --- |
| 2048 | 1 |
| 1024 | 2 |
| 512 | 4 |
| 256 | 8 |

It should be noted that the memory array included in the RAM can be conceptualized as a array having a dimension of "depth" associated with the number of data words each having a "width" (or length). As shown in Table 1, the dimensions of the memory array 111 included in the EAB 112 can range from a depth of 2048 words where each word has a width of 1 bit to a depth of 256 words where each word has a width of 8 bits.

Many applications related to high speed data transmission, for example, typically require data words having widths of 16, 32, 64 bits or greater (i.e., the RAM needs to be relatively "wide"). Since these applications typically use the memory cells in the memory array of the RAM devices for only a relatively short period of time (such as, for example, a FIFO-type application), the total amount of memory required is not large (i.e. the RAM can be "shallow" in that the number of data words, or depth, is not large). However, conventional CPLDs having conventional embedded array blocks, such as the CPLD 100 with the EAB 112-1 and EAB 112-2, can only store data words of these widths by cascading EABs thereby forming a memory array having appropriate dimensions. By way of example, in order for the conventional CPLD 100 to store data words having widths greater than 8 bits, EAB 112-1 and EAB 112-2 must be cascaded using a data path created by programmably connecting the horizontal conductors 114-1 and 114-2 and the vertical conductor 116-1, for example. The data path created by connecting the EAB 112-1 and the EAB 112-2 is circuitous and results in slow signal propagation speeds which can result in non-functionality. The data path can also require use of a large amount of valuable programming resources which limits the ability of the CPLD 100 to fit applications requiring wide data words. Use of a large amount of programming resources to cascade EABs can also limit the ability of the CPLD to fit ancillary logic functions.

It is therefore desirable to have a programmable logic device that has a memory array that can be efficiently configured in a wide shallow architecture.

SUMMARY OF THE INVENTION

The invention relates to a complex programmable logic device capable of efficiently storing data words of varying length. The programmable logic device is capable of efficiently storing the variable length data words by directly connecting memory blocks using dedicated connectors.

Typically, the complex programmable logic device (CPLD) has various functional blocks and memory blocks included therein. The memory blocks include configurable architecture memory blocks well suited for accommodating data having data words of varying length. The CPLD can be a part of a system such as for example, a reconfigurable computer as well as an ATM switch, or the CPLD can be used as a stand alone chip. Any pair of the configurable memory array blocks of the CPLD can be suitably coupled to a control circuit which controls the connecting of the configurable memory array blocks by the dedicated connectors. Having such a memory array helps to preserve valuable programming resources within the CPLD that would otherwise be required to form the data path required to link various conventional memory arrays. By taking advantage of the reprogrammable nature of the CPLD, the invention is capable of providing a configurable memory array capable of configuring its architecture over a wide range as needed. This capability to reconfigure the memory array substantially increases the number of high speed data retrieval and communication applications to which the CPLD can be used.

One embodiment of the invention pertains to an integrated circuit having the inventive array of configurable memory array blocks is disclosed. The inventive integrated circuit includes a plurality of configurable memory array blocks where each of the configurable memory array blocks has at least one memory array that can be configured to store variable length data words as needed. The integrated circuit also includes a plurality of direct connectors suitable for directly connecting selected memory arrays and a control circuit for generating control signals. The control circuit characterizes the data to be stored and based upon the characterization provides control signals to the plurality of configurable memory array blocks. The control signals direct selected ones of the plurality of configurable memory array blocks to configure their respective memory arrays so as to store the characterized data. The control signals also direct selected one or more of the direct connectors to directly connect at least two selected ones of the plurality of configurable memory array blocks so as to store the characterized data when a single configurable memory array block could not store the characterized data.

In another embodiment of the invention, an integrated circuit having a multi-function functional block is disclosed. The multi-function functional block has a plurality of operation modes, one of which enables the multi-function functional block to receive a plurality of variable length data words on input lines. The multi-function functional block also characterizes each of the plurality of variable length data words. The multi-function functional block then configures, as needed, configurable memory array blocks included in the multi-function functional block so as to efficiently store the plurality of variable length data words in the configured configurable memory array blocks. The multi-function functional block then outputs on output lines selected ones of the plurality of data words of variable length as required.

In still another embodiment of the invention, a method of configurablely storing data in a programmable logic device is disclosed. The programmable logic device includes a multi-function functional block having a plurality of operation modes, configurable memory array blocks included in the multi-function functional block, a plurality of input and output lines, and direct connector devices that allow the configurable memory array blocks to be directly interconnected. The inventive method is performed as follows. First, a plurality of variable length data words are received on selected ones of the input lines. Next, each of the received plurality of variable length data words are characterized. Next, the configurable memory array blocks included in said multi-function functional block are configured as needed based upon the characterization so as to efficiently store the plurality of variable length data words. The direct connector devices directly interconnect selected configurable memory array blocks such that the multi-function functional block can efficiently store certain ones of the plurality of data words that have data word lengths that can not be stored in a single one of the configurable memory array blocks. Finally, selected ones of said plurality of data words of variable length are outputted on selected ones of the output lines as required.

Other embodiments and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings where like reference numerals refer to analogous or similar elements to facilitate ease of understanding and which

DETAILED DESCRIPTION OF THE INVENTION

The invention relates to an integrated circuit that includes a configurable architecture memory array capable of efficiently storing data words of varying length. The efficient configurable architecture memory array results from at least a pair of suitably coupled configurable architecture memory blocks appropriately connected to a control function block.

In the following description, numerous specific details are set forth in order to provide a thorough understanding of the present invention. It will be apparent, however, to one skilled in the art that the present invention may be practiced without some or all of these specific details. In other instances, well known structures or operations have not been described in detail in order to not unnecessarily obscure the invention.

Although the invention pertains to an integrated circuit configured having a configurable architecture memory array, the invention is discussed below in the context where the integrated circuit is a CPLD. Generally speaking, a CPLD includes function blocks, programmable routing resources, and input/output ports.

Figure 2:
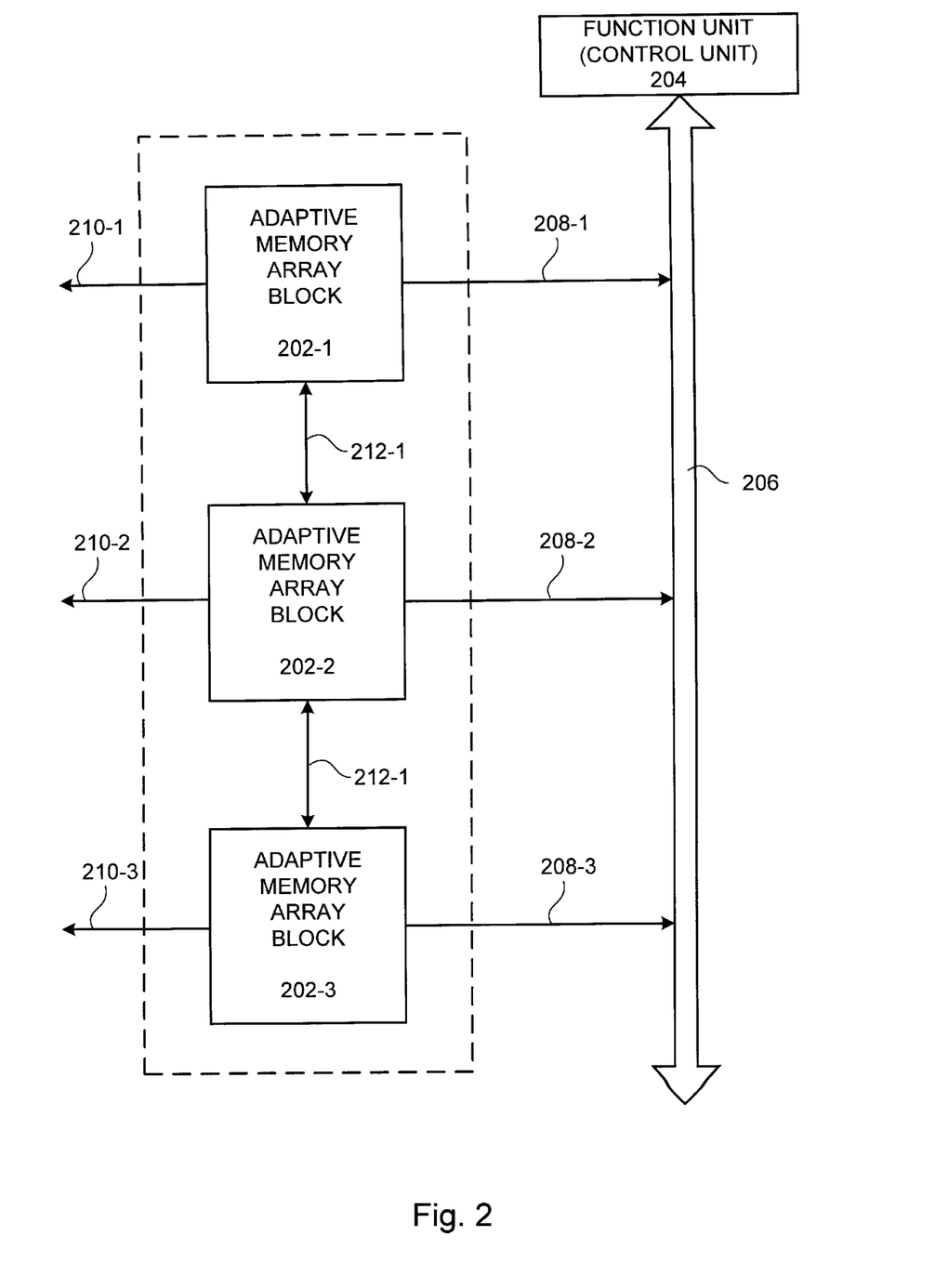
FIG. 2 is a block diagram of a configurable memory array device in accordance with a basic embodiment of the invention.

FIG. 2 is a block diagram of a configurable memory array device 200 in accordance with a basic embodiment of the invention. The configurable memory array device 200 includes configurable memory array blocks 202 (202-1 through 202-3) connected to a functional block 204 by way of a signal bus 206. The signal bus 206 carries signals, both data and control, from the functional block 204 to the configurable memory array blocks 202-1 through 202-3 by way of bi-directional signal lines 208-1 through 208-3, respectively. The configurable memory array blocks 202-1 through 202-3 respectively connect to external circuitry by way of bi-directional input/output (I/O) lines 210-1 through 210-3.

In one embodiment, the external circuitry provides signals to the configurable memory array blocks 210-1 through 210-3 using the I/O lines 210-1 through 210-3, respectively. The signals typically take the form of data words formed of a number n data bits, where n is indicative of the length of the associated data word. For example, data word DAT1 can have a length of 8 bits (i.e., n=8), whereas data word DAT2, and data word DAT3 can each have lengths of 16 bits (i.e., n=16) and 32 bits (i.e., n=32), respectively. It should be noted that a data word can have any length (i.e., any number of data bits) deemed suitable for the application at hand.

The functional block 204 can be programmed to function as a control circuit 204. So programmed, the control circuit 204 determines characteristics of the data words, such as length (indicative of the width of the memory array), received at the I/O lines 210-1 through 210-3. Based upon the determining, the control circuit 204 then directs appropriate ones of the configurable memory array blocks 202 to adapt their respective architectures as required to store the characterized data words. When appropriate (such as when the received data word cannot be efficiently stored in a single configurable memory array block, for example), the control circuit 204 directs direct connectors 212-1 through 212-2 to directly connect selected ones of the configurable memory array blocks 202-1 through 202-3 to form an array of configurable memory array blocks 214. When appropriate, the array of configurable memory array blocks 214 operates to efficiently store groups of data words having a wide range of lengths and widths. In so doing, the array of configurable memory array blocks 214 can substantially increase the number of applications that the CPLD can efficiently implement.

It should be noted that direct connectors 212 typically do not have access to programming routing resources used to interconnect function blocks included in the CPLD. In this way, the valuable programmable routing resources are preserved for fitting logic functions by the CPLD. Instead, the direct connectors 212 provide direct connections between the configurable memory blocks 214 under the control of the control circuit 204. When appropriate, the control circuit 204 sets the depth of the array of configurable memory array blocks 214 as required by the application.

For example, a plurality of data words including data word DAT1, data word DAT2, and data word DAT3 can be sent by external circuitry, for example, to the configurable memory array blocks 202. More particularly, data word DAT1 is received at the I/O line 210-1 associated with the configurable memory array block 202-1, a data word DAT2 is received at the I/O line 210-2 associated with the configurable memory array block 202-2, and while a data word DAT3 is received at the I/O line 210-3 associated with the configurable memory array block 202-3. The control circuit 204 sets the width of the array of configurable memory array block 214 by characterizing each of the received data words DAT1, DAT2, and DAT3 for data word length. After the characterization of data word length, the control circuit 204 then directs selected ones of the configurable memory array blocks 202 to appropriately adapt their respective architectures so as to store the characterized data word. The control circuit 204 sets the memory array depth by directing selected ones of the direct connectors 212 to directly connect selected ones of the configurable memory array blocks 202 as needed.

If the control circuit 204 determines that any one of the configurable memory array blocks 202 cannot by itself handle a particular received data word, then a connect signal is sent to appropriate direct connectors 212 which, in turn, directly connect appropriate ones of the configurable memory array blocks 202. The directly connected configurable memory array blocks are then capable of storing the particular received data word.

For example, assume that the configurable memory array blocks 202-1 and 202-2 can each only store data words up to and including 16 bits in length. If the control circuit 204 determines that the data word DAT1 is 32 bits in length, for example, a connect signal generated by the control circuit 204 directs the direct connector 212-1 to directly connect the configurable memory array blocks 202-1 and 202-2. The directly connected configurable memory array blocks 202-1 and 202-2 are then capable of storing the data word DAT1. In this way, both the memory array blocks 202-1 and 202-2 are used substantially simultaneously to store the data word DAT1.

The configurable memory array according to the invention is normally formed in an integrated circuit. In a detailed embodiment of the invention discussed below, the configurable memory array is formed in a CPLD.

Asynchronous transmission mode (ATM) circuits typically include high speed data transmission switches, referred to as ATM switches, that generally require large blocks of data be stored in memory. This memory must be capable of accommodating data of varying lengths for varying periods of time. ATM switching techniques are well known in the art and described, for example, in David Ginsburg "ATM: solutions for enterprise internetworking", 1st Edition, Addison Wesley Publishing Company (1996).

Continuing the example of the ATM switch, ATM data cells each generally include what is referred to in the art as a payload portion and a header portion. Typically, the header portion includes informational data fields, or data words, related to transmission protocols such as Quality of Service (QoS) parameters, traffic control parameters, traffic shaping, and the like. The data cell payload portion includes data fields, or data words, containing the information that is being transmitted by the ATM circuit formed in the CPLD configured to operate as the ATM switch. One well known approach to efficiently switching ATM data cells involves bifurcating, for example, the ATM data cell into the header portion and the payload portion.

After the bifurcation process, the header portion data words are stored in memory generally separate from but linked with memory into which the payload portion data words are stored. In this manner, the QoS parameters included in the header portion, for example, can be processed separately from the information data words included the payload portion. The header portion data words typically are processed separately from the payload portion data words since the payload portion data words must remain intact whereas the header portion data words are manipulated in such a way as to increase processing speeds within the ATM switch.

Conventional ATM switches typically utilize separate and distinct memory arrays, referred to as queues, at both the source port (or source ports) and the destination port (or destination ports) each being configured to store the header portion data words and the payload portion data words. The conventional approach to storing data in the ATM switch queue substantially degrades the speed performance of the ATM switch. One cause of this speed performance degradation is the delay caused by the serpentine data paths required to connect the multiplicity of memory locations into which the various portions of the bifurcated ATM data cell have been stored. The substantial delays due to, for example, these serpentine data paths degrades the switching speed performance of the ATM switch, and thereby, the transmission rate of the ATM circuit containing the ATM switch.

Figure 3:
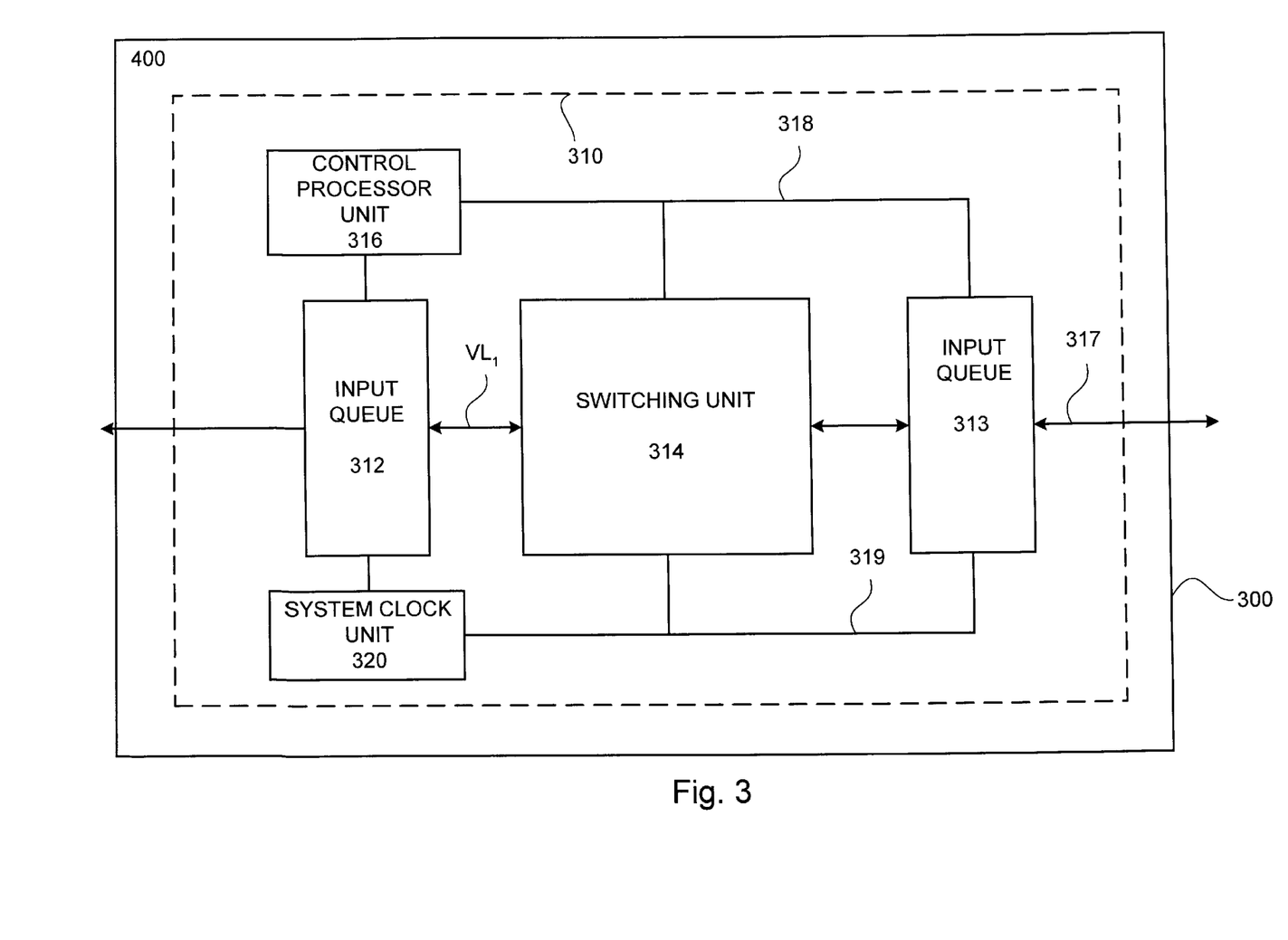
FIG. 3 is a block diagram of a CPLD configured to operate as an ATM switch in accordance with an embodiment of the invention.

By using the inventive CPLD for implementing an ATM switch, the speed performance degradation caused by using the conventional approach to storing data in ATM switch queues is avoided. FIG. 3 is a block diagram of a CPLD 300 configured to operate as an ATM switch 310 in accordance with an embodiment of the invention. It should be noted that in the described embodiment, for sake of clarity, only a unicast virtual circuit $VC_u$ is described having a single source port and a single destination port. More generally, the CPLD 300 can be used to implement an ATM switch that can be used to implement whatever form of virtual circuit VC that is deemed appropriate by the application being fitted. In addition, any reference to input and output is for descriptive convenience since the ATM switch is bi-directional in nature.

The ATM switch 310 includes an input queue 312 and an output queue 313 bi-directionally connected by way of input/output (I/O) busses 315 and 317, respectively, to external circuitry capable of generating and receiving ATM data cells. Such external circuitry can include digital communications devices such as digital computers, digital video/audio equipment, and digital telephones. In another embodiment, a converter circuit suitable for converting analog and/or digital signals to appropriate ATM formats, or vice versa, can be included, for example, in the external circuitry or within the ATM switch itself.

The ATM switch 310 also includes an ATM switching unit 314 suitable for switching the ATM cell payload portions along a switch unit virtual link connecting selected I/O ports of the ATM switching unit 314 as directed by a control processor unit 316. A control signal bus 318 connects the control processor unit 316 to the switch unit 314, the input queue 312 as well as the output queue 313. The control processor unit 316 uses information contained within the ATM data cell header portion (such as QoS parameters) to maintain the proper flow (referred to as traffic) of ATM data cell payload portions along virtual links $V_L$ which cumulatively form the unicast virtual circuit $VC_u$. A system clock unit 320 is connected to the input queue 312, the output queue 313, as well as the switch unit 314 by way of a clock signal line 319. In another embodiment, the control processor unit 316 and the system clock unit 320 can be integrally formed so as to eliminate the use of a separate system clock line. In that embodiment, a control signal bus carries control signals which include system clock signals.

In the described embodiment, the system clock unit 320 provides a system clock signal suitable for maintaining temporal relationships between ATM data cell payload portions passing along the unicast virtual circuit $VC_u$ and the associated ATM data cell header portions stored in the input queue 312 and/or the output queue 313. The system clock signal can also help to co-ordinate the flow of many different associated groups of ATM data cell payload portions (referred to as "calls") passing along different virtual circuits VC formed in the CPLD 300.

During operation, the ATM data cell header portion and the associated ATM data cell payload portion are concurrently passed in synchrony to the input queue 312 by way of the I/O bus 322. A bifurcation process is then performed on the ATM data cell such that the header portion and the payload portion of the ATM data cell are identified, or otherwise, made separable. The input queue 312 then appropriately stores the ATM data cell header portion and the ATM data cell payload portion. In one embodiment, the control processor unit 316 uses the ATM data cell header portion stored in the input queue 312 in the formation of the unicast virtual circuit $VC_u$. The unicast virtual circuit $VC_u$ is formed by connectively linking the input queue 312 to the output queue 313 by way of virtual links $V_{L1}$ through $V_{Lm}$. For example, the unicast virtual circuit $VC_u$ is formed by connecting the input queue 312 to the ATM switching unit 314 by way of the virtual link $V_{L1}$. The switch unit virtual link connects the virtual link $V_{L1}$ to a virtual link $V_{Lm}$ which, in turn, is connected to the output queue 313. In this way, an ATM data cell payload portion passes from the I/O bus 315 to the I/O bus 317 along the unicast virtual circuit $VC_u$.

Typically, the ATM data cell header portion includes a plurality of data words ranging from 1 bit to 20 bits, or more, in length. In contrast, the ATM data cell payload portion contains 53 data words (referred to as an "octet") each having a length of 8 bits. The control processor unit 316 characterizes the data words being sent to the input queue 312 by determining parameters such as data word length and type (either header or payload type data word, for example). Such parameters are used by the control processor unit 316 in directing the input queue 312 and/or the output queue 313 to efficiently store the received data words. In another embodiment, the external circuitry generates instructions carried by the I/O bus 315 that directs the input queue 312 to efficiently store the various data words being sent by the external circuitry.

After the incoming data words are characterized, the control processor unit 316 sends control signals along the control signal bus 318 to the input queue 312 and the output queue 313. The control signals direct the input queue 312 and the output queue 313 to store the received data words.

Figure 4:
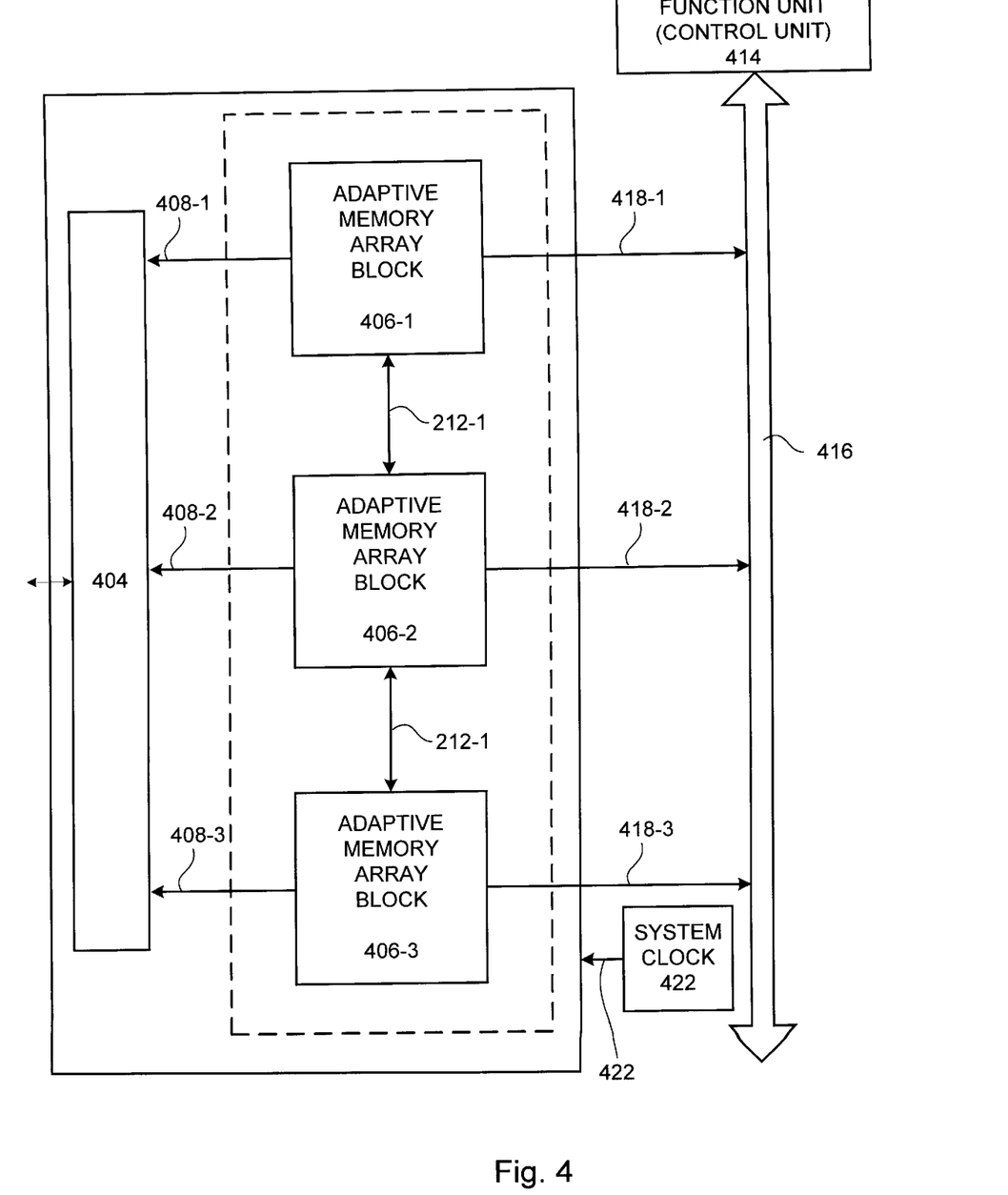
FIG. 4 is a circuit diagram of a representative portion of the ATM switch illustrated in FIG. 3.

FIG. 4 is a circuit diagram of a representative portion 400 of the ATM switch 310 illustrated in FIG. 3. The representative portion 400 includes an input queue unit 402 having an input data buffer unit 404. The input data buffer unit 404 is connected to configurable memory array blocks 406-1 through 406-3 by way of I/O signal lines 408-1 through 408-3, respectively. Interconnectors 410-1 and 410-2 selectably and directly connect particular ones of the configurable memory array blocks 406-1 through 406-3 to form an array of configurable memory array blocks 412. A controller processor unit 414 supplies signals, including both data and control signals, to a signal bus 416. These signals are passed to the configurable memory array blocks 406-1 through 406-3 as well as the interconnectors 410-1 and 410-2 by way of signal lines 418-1 through 418-3. An input/output (I/O) bus 420 connects external circuitry to the input data buffer unit 404 included in the input queue unit 402. A system clock 422 supplies clock signals by way of a system clock signal line 424 to the input queue unit 402.

During operation, external circuitry, such as digital computers, digital video/audio equipment, and the like, send ATM data cells associated with a "call" to the input data buffer data unit 404 included in the input queue unit 402 by way of the I/O bus 420. Circuitry within the input buffer data unit 404 processes the ATM data cells. In the described embodiment, the ATM data cells are split, or bifurcated, into the ATM data cell payload portion and the ATM data cell header portion within the input data buffer data unit 404.

At an appropriate clock signal, the ATM data cell payload portion data words are output at the input line 408-1 substantially simultaneously with the ATM data cell header portion data words being output at the input line 408-3, for example. The controller processor unit 414 then characterizes the ATM data cell header portion data words as well as the ATM data cell payload portion data words for such characteristics as length. Based upon the characterization, the controller processor unit 414 generates control signals. The control signals are sent to selected ones of the configurable memory array blocks 406 by way of the signal lines 418-1 through 418-3. The control signals cause the selected configurable memory array blocks 406 to adapt as needed to efficiently store the incoming data words.

More particularly, the configurable memory array block 406-1 receives ATM data cell payload portion data words arranged to have a fixed length of 8 bits and a fixed depth of 53 words. In contrast, the ATM data cell header portion data words can have a range of length from 1 bit to 20 bits, or more. The depth of the memory array required to store the ATM data cell header portion data words is dependent upon the particular data processing algorithm executed by the controller processor unit 414 to process the received data words. Based upon the instructions provided by the data processing algorithm, the controller processor unit 414 generates appropriate control signals.

Continuing the example, assume that the ATM data cell header portion data words received at the I/O signal line 408-3 require greater memory array width than the configurable memory array block 406-3 can efficiently provide by itself. Based upon the characterization performed on the received ATM data cell header portion data words, the controller processor unit 414 generates control signals that cause the interconnector 410-2 to directly connect the configurable memory array blocks 406-2 and 406-3. So connected, the configurable memory array blocks 406-2 and 406-3 together are able to efficiently store the ATM data cell header portion data words received at the I/O signal line 408-3.

By using the interconnectors 410-1 through 410-2 to directly connect the configurable memory array blocks 406-1 through 406-3, the input queue unit 402 is able to efficiently store groups of data words of varying lengths or widths. By efficiently storing these groups of data words, speed performance degradation evident in ATM switches formed in conventional CPLDs is avoided.

Figure 5:
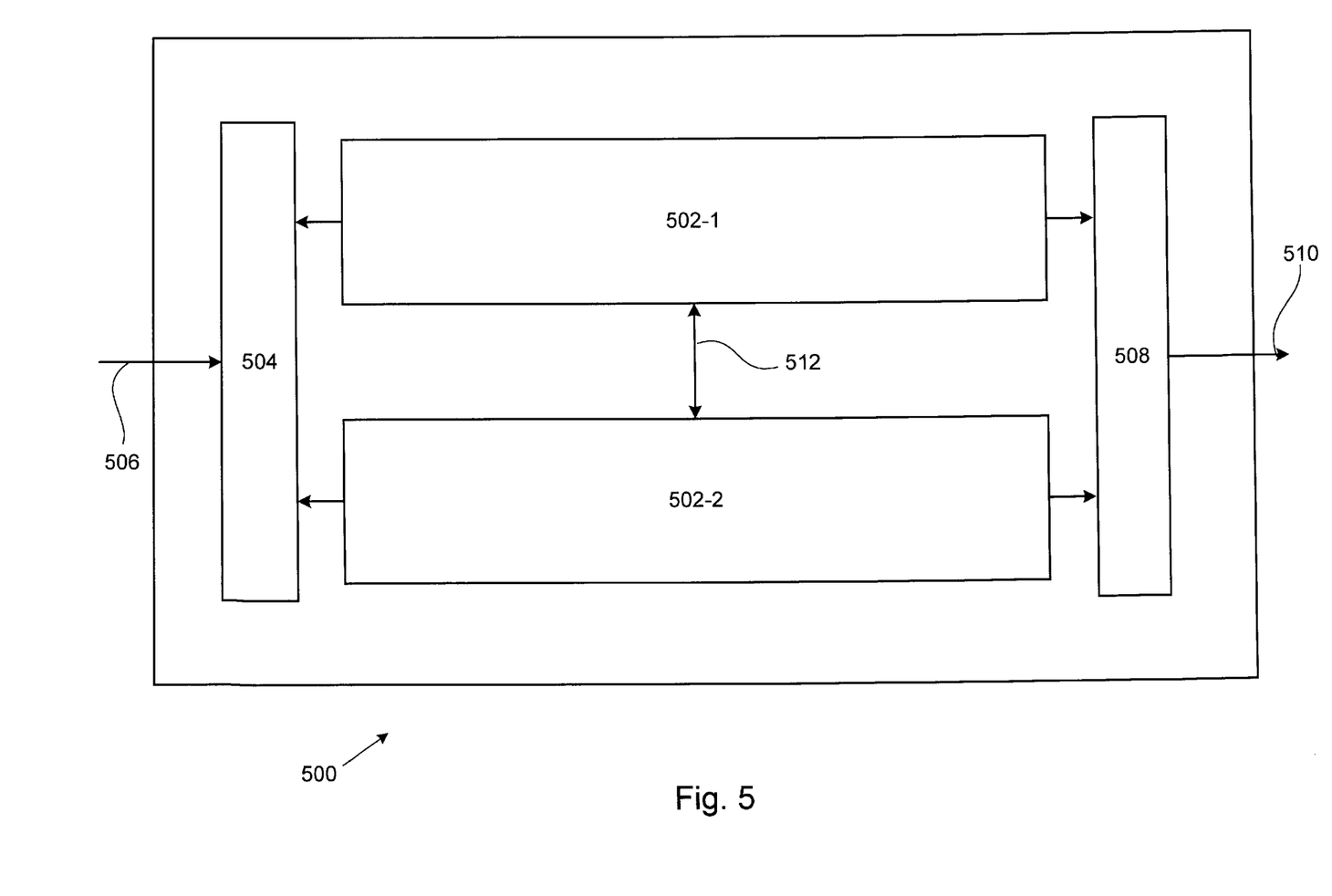
FIG. 5 is a circuit diagram of an embedded configurable array block in accordance with another embodiment of the invention.

FIG. 5 is a circuit diagram of an embedded configurable array block (EAAB) 500 in accordance with another embodiment of the invention. The EAAB 500 includes configurable memory array blocks 502-1 and 502-2 each connected to an input data buffer unit 504. The input data buffer unit 504 is, in turn, connected to external circuitry by way of an input bus 506. Each of the configurable memory array blocks 502-1 through 502-2 are also connected to an output data buffer unit 508. The output data buffer unit 508 is, in turn, connected to external circuitry by way of an output bus 510. It should be noted that any reference to input and output is for descriptive convenience only since the EAAB 500 is bi-directional in nature.

The EAAB 500 is typically found in a CPLD but can in fact be utilized in any form of integrated circuit deemed appropriate for the application at hand. In a CPLD, for example, the EAAB 500 is capable of efficiently storing data fields, or data words, having a wide range of characteristics such as length or width. The EAAB 500 accomplishes this efficient storage by its ability to configurably reconfigure and directly connect storage media(such as the configurable memory array blocks 502-1 and 502-2) into which these data words are to stored.

In cases where more than one of the configurable memory array blocks 502 is required to efficiently store the received data word, a connector 512 is used to directly connect the configurable memory array blocks 502-1 and 502-2. In this way, the EAAB 500 is capable of efficiently storing data words having a wide range of lengths and widths without resorting to using valuable programming resources that could otherwise be used to fit desired logic functions. For at least this reason, the use of the EAAB 500 in CPLD and CPLD-type integrated circuits is highly desirable.

Figure 6:
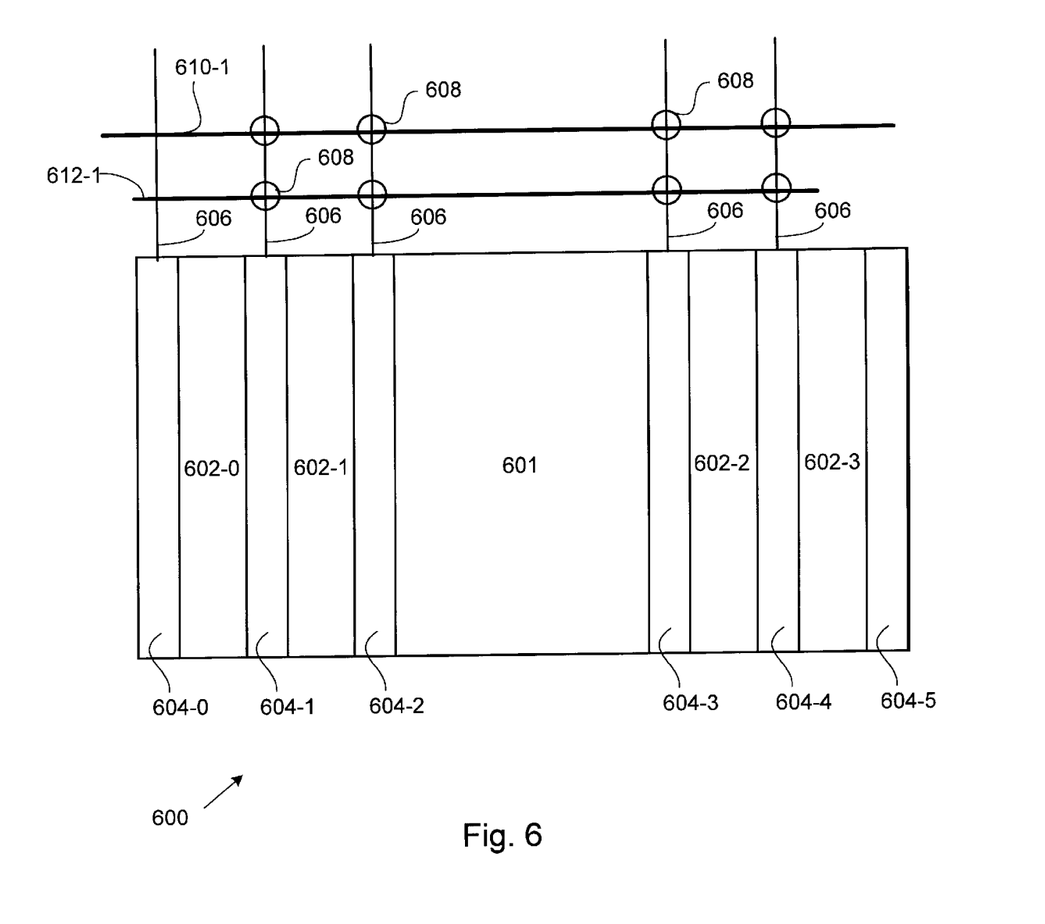
FIG. 6 is a block diagram of a multi-function block that incorporates the embedded configurable array block illustrated in FIG. 5.

FIG. 6 is a block diagram of a multi-function block 600 that includes an EAAB 601 in accordance with an embodiment of the invention. The multi-function block 600 includes a group of function units 602 (602-0 through 602-3) and the EAAB 601 interconnected by way of programmable interconnect arrays 604 (604-0 through 604-6). Each of the programmable interconnect arrays 604 receives a group of programmable interconnect array I/O lines 606. Each of the programmable interconnect array I/O lines 606 has an associated group of programmable connectors 608 that are programmed by programming resources and operate to selectively connect the interconnect array I/O lines 606 (and thus the function units 602 and the EAAB 601) to other conductor lines such as a global horizontal conductor 610-1 and/or a local vertical conductor 612-1. It should be noted that only a few of the programmable connectors 608 are shown for sake of clarity since there can be any suitable number of the programmable connectors 608 included in the CPLD.

Although not required, the multi-function block 601 is often included in an integrated circuit such as a CPLD, and each of the function units 602 included in the multi-function block 600 can be configured in many operational modes as deemed suited for a desired application. By way of example, the function unit 602-1 can be a logic array block (LAB) while the function unit 602-2 can be an embedded array block (EAB). The multi-function block is normally formed in an integrated circuit. In a detailed embodiment of the invention discussed below, a plurality of the multi-function blocks are formed in a CPLD.

Figure 7:
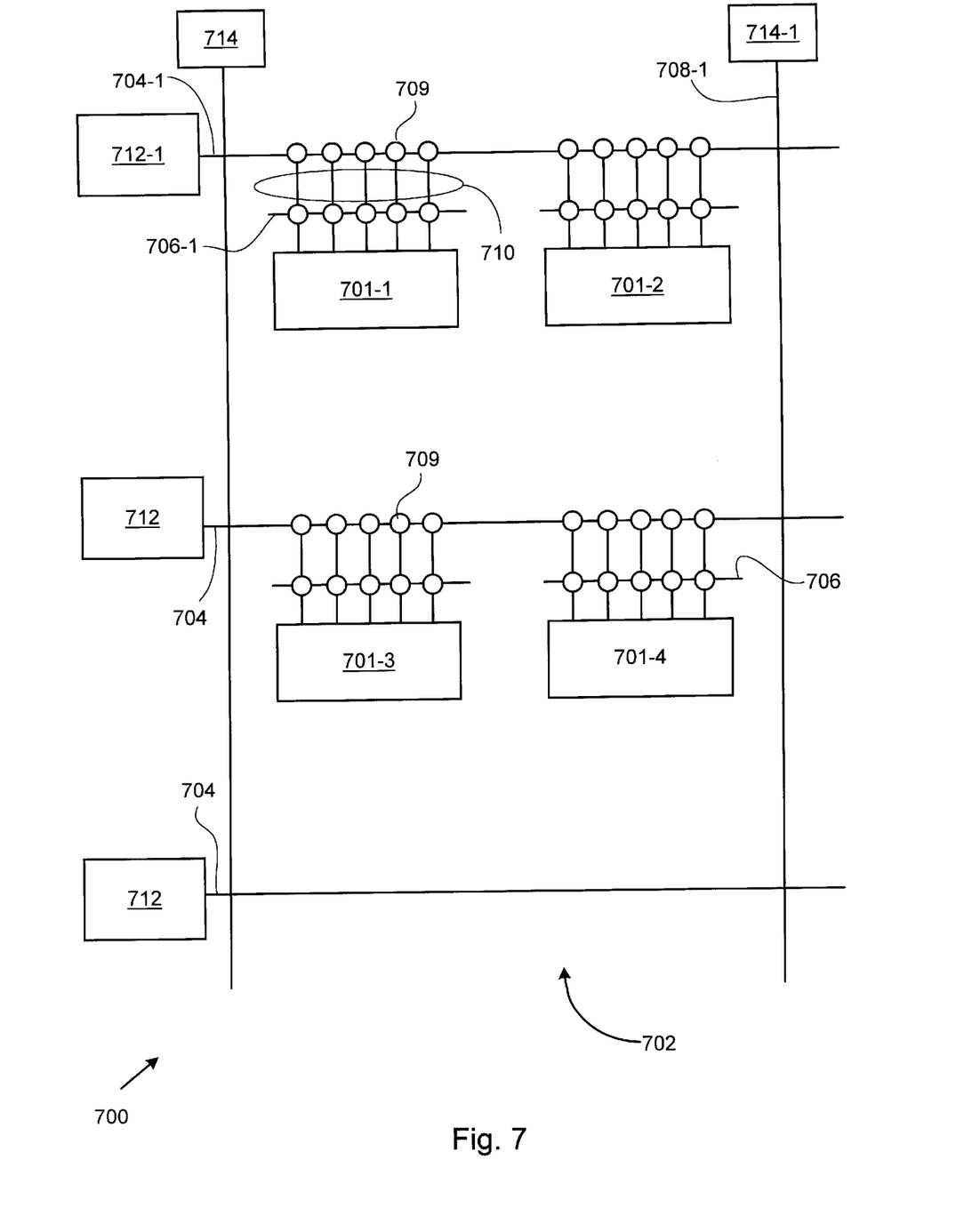
FIG. 7 is a block diagram of a CPLD that includes a plurality of the multi-function blocks shown in FIG. 6.

FIG. 7 is a block diagram of a CPLD 700 that includes a plurality of the multi-function blocks in accordance with an embodiment of the invention. Although only a few of the multi-function blocks are illustrated in FIG. 7, it should be appreciated that any number may be provided in order to meet the needs of a particular system.

As shown in FIG. 7, the CPLD 700 includes a plurality of multi-function blocks 701 (701 -1 through 701-4) included in a core region 702. Each of the multi-function blocks 701 are, respectively, programmably connected to a global horizontal conductor 704, a local horizontal conductor 706 as well as a global vertical conductor 708 to implement logical circuits within the CPLD 700. In one embodiment, the multi-function block 701-1 is connected to a global horizontal conductor 704-1 and a local horizontal conductor 706-1 by way of programmable interconnect array I/O lines 710 using programmable connectors 709. In this way, the multi-function blocks 700-1 can communicate with any other of the multi-function blocks 701 included in the CPLD 700. The multi-function block 701-1 also communicates with any external circuitry by way of the horizontal bi-directional ports 712 and/or the vertical bi-directional ports 714. For example, either of the multi-function blocks 701-1 or 702-2 can connect to the horizontal bi-directional port 714-1 via the global horizontal conductor 704-1. In one embodiment, the multi-function blocks 701 are constructed as are the multi-function block 600 illustrated in FIG. 6.

Several advantages in fitting a logic function in a CPLD using the invention stem from its ability to substantially increase the probability of fitting functions that utilize data words having a wide range of characteristics, such as length and/or width. The probability is substantially increased because circuitous routing used in conventional CPLDs to couple disparately located storage media used to store the data words is eliminated. Another advantage relates to the increased flexibility afforded by the ability of the inventive CPLD to efficiently store data words having a wide range of lengths and/or widths. This increase in flexibility results a commensurate increase in the number of applications to which the inventive CPLD can practically be applied. Such applications include high speed data transmission (ATM switch, for example), complex logic and memory functions that require wide-shallow memory storage (such as FIFO-type applications) and the like. Consequently, this increase in flexibility enables the CPLD to fit more complex logic functions more often than is possible with conventional CPLD architectures.

Although the foregoing invention has been described in some detail for purposes of clarity of understanding, it will be apparent that certain changes and modifications may be practiced within the scope of the appended claims. It should be noted that there are many alternative ways of implementing the present invention. It is therefore intended that the following appended claims be interpreted as including all such alterations, permutations, and equivalents as fall within the spirit and scope of the present invention.

What is claimed is:

1. An integrated circuit, comprising:

a programmable function block;

a plurality of configurable memory array blocks, wherein each of said configurable memory array blocks includes, at least one configurable memory array that can be configured to store a variable length data word, wherein each of said configurable memory arrays includes, a plurality of memory cells suitable for storing a data word, wherein certain ones of said plurality of memory cells can be configurably arranged in a row-wise manner forming thereby a row of memory cells having an associated variable row length based upon a particular data word length of a particular data word to be stored in the memory array, wherein said row width being set by said programmable function block to accommodate said variable length data word;

a plurality of direct connectors between the plurality of configurable memory array blocks; and a control circuit for providing control signals, said control circuit characterizes said data to be stored and based upon said characterization provides signals to said plurality of configurable memory array blocks, said signals direct selected ones of said plurality of configurable memory array blocks to configure their respective memory arrays so as to store said characterized data, and wherein said signals direct selected one or more of said direct connectors to directly connect at least two selected ones of said plurality of configurable memory array blocks so as to store said characterized data when a single configurable memory array block could not store said characterized data.

2. An integrated circuit as recited in claim 1, wherein certain ones of said plurality of memory cells can be configurably arranged in a column-wise fashion forming thereby a column of memory cells having an associated column length.

3. An integrated circuit as recited in claim 2, wherein said configurably arranged column of memory cells stores a plurality of said data words, said column length being set by said programmable function block to accommodate said plurality of said data words.

4. An integrated circuit as recited in claim 3, wherein said integrated circuit is a programmable logic device.

5. An integrated circuit as recited in claim 4 wherein said programmable function block is an embedded array block, said embedded array block can store executable directions suitable for directing the configurable memory array blocks, said embedded array block also performs desired memory and logic-memory functions.

6. An integrated circuit as recited in claim 4 wherein said programmable function block is an logic array block, said logic array block can store executable directions suitable for directing the configurable memory array blocks, said logic array block also performs desired logic functions.

7. An integrated circuit as recited in claim 6 wherein said memory cell is a static random access memory (RAM) cell.

8. An integrated circuit as recited in claim 1 wherein said programmable function block is an embedded array block, said embedded array block can store executable directions suitable for directing the configurable memory array blocks, said embedded array block also performs desired memory and logic-memory functions.

9. An integrated circuit as recited in claim 1 wherein said programmable function block is an logic array block, said logic array block can store executable directions suitable for directing the configurable memory array blocks, said logic array block also performs desired logic functions.

10. A method of configurably storing data in a programmable logic device, said programmable logic device includes a multi-function functional block having a plurality of operation modes, configurable memory array blocks each having an array of memory cells suitable for storing data configurably arranged in a row-like fashion to form a row of memory cells and configurably arranged in a column-wise fashion to form a column of memory cells included in said multi-function functional block, a plurality of input and output lines, and direct connection devices that allow configurable memory array blocks included in said multi-function functional block to be directly connected, said method comprising:

receiving a plurality of variable length data words on selected ones of said input lines;

characterizing each of said plurality of variable length data words;

configuring based upon said characterizing, as needed, said configurable memory array blocks included in said multi-function functional block so as to efficiently store said plurality of variable length data words in said configured configurable memory array blocks, wherein said direct connection devices directly connect selected configurable memory array blocks such that said multi-function functional block can efficiently store said plurality of data words that have data word lengths that can not be stored in a single one of said configurable memory array blocks; and outputting on selected ones of said output lines selected ones of said plurality of data words of variable length as required.

11. A method of configurably storing data in a programmable logic device as recited in claim 10, wherein if any of said plurality of data words have data word lengths that are of such a length so as to prevent said data words from being efficiently stored in a single one of said configurable memory array blocks, selected ones of said direct interconnection devices are directed to directly connect selected configurable memory array blocks such that said multi-function functional block can efficiently store said data words.

12. A method of configurably storing data in a programmable logic device as recited in claim 10, wherein if any of said plurality of data words have data word widths that are of such a width so as to prevent said data words from being efficiently stored in a single one of said configurable memory array blocks, selected ones of said direct interconnection devices are directed to directly connect selected configurable memory array blocks such that said multi-function functional block can efficiently store said data words.

* * * * *